United States Patent [19]

Irving et al.

[11] Patent Number: 4,604,344

[45] Date of Patent: Aug. 5, 1986

[54] PROCESS FOR THE PRODUCTION OF IMAGES USING SEQUENTIALLY LIQUID POLYMERIZING COMPOSITIONS AND PHOTOCURING

[75] Inventors: Edward Irving, Burwell; Terence J. Smith, Royston, both of England

[73] Assignee: Ciba-Geigy Corporation, Ardsley, N.Y.

[21] Appl. No.: 694,178

[22] Filed: Jan. 23, 1985

[30] Foreign Application Priority Data

Feb. 3, 1984 [GB] United Kingdom ............... 8402937

[51] Int. Cl.$^4$ ........................... G03C 7/26; G03C 5/16
[52] U.S. Cl. ..................................... 430/325; 430/327; 430/18; 430/281; 430/280; 430/270; 430/286; 430/271
[58] Field of Search ................ 430/325, 327, 18, 281, 430/280, 270, 286, 271

[56] References Cited

U.S. PATENT DOCUMENTS

| | | |
|---|---|---|
| 3,016,297 | 1/1962 | Mochel et al. ................. 430/281 X |
| 3,027,278 | 3/1962 | Reick .................................. 117/226 |
| 3,053,690 | 9/1962 | Jaffe et al. ............................ 117/72 |
| 3,196,035 | 7/1965 | Yanaglhara et al. ................ 117/47 |
| 3,218,190 | 11/1965 | Patterson et al. .................... 117/72 |
| 3,424,699 | 1/1969 | Stark et al. ............................ 260/2 |
| 3,473,949 | 10/1969 | Eldred et al. ...................... 117/62.2 |
| 3,493,418 | 2/1970 | Amano ................................. 117/72 |
| 3,523,032 | 8/1970 | Kujas .................................... 117/47 |
| 3,650,802 | 3/1972 | Kehr et al. ........................ 117/47 R |
| 3,726,679 | 4/1973 | Abolafia et al. ..................... 430/325 |
| 3,784,647 | 1/1974 | Fleming et al. ............. 260/830 TW |
| 4,026,858 | 5/1977 | Andrews et al. ................... 260/30.2 |
| 4,042,442 | 8/1977 | Dombroski et al. ................. 427/302 |
| 4,058,400 | 11/1977 | Crivello ......................... 204/159.18 |
| 4,058,401 | 11/1977 | Crivello ......................... 204/159.18 |
| 4,101,459 | 7/1978 | Andrews ......................... 260/18 EP |
| 4,115,296 | 9/1978 | Andrews ............................... 528/92 |
| 4,130,511 | 12/1978 | Andrews ............................... 528/92 |
| 4,173,682 | 11/1979 | Noomen et al. ..................... 428/423 |
| 4,241,171 | 12/1980 | Clapp et al. ......................... 430/539 |
| 4,291,118 | 9/1981 | Boduch et al. ...................... 430/327 |
| 4,299,938 | 11/1981 | Green et al. ......................... 526/192 |
| 4,339,567 | 7/1982 | Green et al. ......................... 528/102 |
| 4,351,930 | 9/1982 | Patnaik ................................ 526/125 |
| 4,383,025 | 5/1983 | Green et al. ......................... 430/280 |
| 4,408,034 | 10/1983 | Kazama et al. ....................... 528/54 |
| 4,500,629 | 2/1985 | Irving et al. ........................ 430/325 |
| 4,546,067 | 10/1985 | Irving et al. ................... 430/330 X |

FOREIGN PATENT DOCUMENTS 1293722 10/1972 United Kingdom .

OTHER PUBLICATIONS

F. M. Beringer et al, J. Org. Chem., 33, 2981 (1968).

*Primary Examiner*—John E. Kittle
*Assistant Examiner*—Cynthia Hamilton
*Attorney, Agent, or Firm*—Luther A. R. Hall

[57] ABSTRACT

A polymerizing agent is applied to a substrate followed by a layer of a liquid composition containing both a polymerizable residue and a photocurable residue. The polymerizable residue is polymerized by the polymerizing agent first applied so that the layer solidifies but remains photocurable. Subsequently this solidified layer is exposed to actinic radiation in a predetermined pattern and those parts of the layer that are not photocured are removed by treatment with a suitable solvent.

Typical polymerizable residues include cyanoacrylates, the polymerizing agents for which may be water, ammonium hydroxide solution, an alkali metal hydroxide solution, or an amine. Typical photocurable residues include acrylates and methacrylates.

The process is suitable for the manufacture of printing plates and printed circuits.

20 Claims, No Drawings

PROCESS FOR THE PRODUCTION OF IMAGES USING SEQUENTIALLY LIQUID POLYMERIZING COMPOSITIONS AND PHOTOCURING

This invention relates to a process for the production of images by application of a polymerisable resin to a substrate pretreated with a polymerising agent, followed by exposure to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through a negative whereby the parts of the film struck by the irradiation become photopolymerised (and less soluble) while those parts shielded from the irradiation remain substantially unaffected, then dissolving away the unirradiated, non-photopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation, without the use of organic solvents. Not only would, in this stage, the use be avoided of solvents which might present problems of flammability and cause expense in their recovery, but the production on a continuous basis of coated supports, ready for irradiation, would be facilitated.

We have found that this object can be achieved by the application of certain liquid compositions which contain groups through which polymerisation and photocuring can occur to substrates that have been pretreated with a polymerising agent. These groups may form part of the same molecule, or they may form part of different molecules. The groups are chosen so that polymerisation of a layer of a liquid composition occurs to form a solid, essentially tack-free layer, which is, however, still soluble in certain solvents. When desired, a part or parts of the layer are subjected to actinic radiation and photocuring takes place in the already polymerised layer, the parts of the layer which undergo photocuring becoming much more resistant to solution in the solvent.

U.S. Pat. No. 4,291,118 relates to a method for forming relief images from a film of a liquid photopolymerisable material, comprising exposing the film to chemical hardening treatment sufficiently to solidify it, then treating the solidified film in a pattern in a manner differentiating the chemical condition of the film in the pattern as distinct from the chemical condition of the solidified mass not in the pattern, and then selectively removing the portion of the mass in one of the chemical conditions leaving that portion of the mass in the other chemical condition to form a relief image. To bring about the differentiation in chemical condition actinic radiation is used in all the embodiments described.

In the process described in this U.S. patent, therefore, the film of liquid material is exposed to actinic radiation and then the solidified film is re-exposed to actinic radiation in the form of a pattern so that a part or parts of it become less easily removed by a solvent, and finally the image is developed by washing away with the solvent the more readily removed part of parts i.e., those which were not reexposed.

The conditions of exposure have to be carefully controlled; if the first exposure is insufficient, the solidified material remains tacky and inconvenient to handle whereas if it is excessive, images of poor definition are obtained.

Only the use of photopolymerisable polyene-polythiol compositions is described. In the context of the process described in the U.S. patent, these have the disadvantage that the polymerisation which is initiated on exposure to actinic radiation continues when such exposure is interrupted. It follows that if images of good quality are to be obtained the second irradiation stage must be performed without delay. This is a constraint on industrial utilisation of the process.

The use of a pretreatment to a substrate to effect polymerisation of a subsequently-applied resin is a well known technique. In U.S. Pat. No. 3,027,278, for example, there is described a method of coating an inorganic surface in which a layer of water containing an amine is first applied, and then the surface is subjected to phenol formaldehyde vapours. When the surface is heated the organic materials polymerise.

U.S. Pat. No. 3,053,690 describes a method of coating in which an article is first primed with a phenolic resin, then sprayed with a mixture of ethyl acetate and concentrated sulphuric acid, the solvent is allowed to evaporate and a furfuryl alcohol resin is applied, the residual acid hardening the furfuryl alcohol resin.

U.S. Pat. No. 3,196,035 describes a method of coating a polyester fibre with a polyisocyanate, and then treating the coated fibre with an epoxy resin. Epoxy resins are also used to coat fibres in U.S. Pat. No. 3,523,032, but in this patent pretreatment is effected by application of an imidazole.

In U.S. Pat. No. 3,218,190 there is described a process for coating surfaces in which a peroxide catalyst is applied in a solvent, the solvent is evaporated, and an unsaturated polyester is then applied. The peroxide catalyst causes the polyester to cure.

The use of water as a pretreatment is described in U.S. Pat. No. 3,493,418. In this patent a film-forming binder containing water is first applied to a substrate, and then a moisture-curable urethane prepolymer is applied. Water from the first layer migrates into the second and effects curing.

In U.S. Pat. No. 3,650,802 there is described the use of an iron-containing material, such as ferric acetylacetonate, to coat a substrate which is subsequently coated with a mixture of a polythiol, a polyene, and optionally an oxime ester. The polythiol polyene mixture then cures.

The use of caffeine and theobromine as polymerisation initiators is described in U.S. Pat. No. 4,042,442. In this patent, a solution of the alkaloid in a solvent, such as water, acetone, or an alcohol, is applied to a surface, and then a monomeric ester of 2-cyanoacrylic acid is applied. Polymerisation of this ester follows rapidly.

U.S. Pat. No. 3,473,949 describes a method of forming an acrylic resin coating in which N,N-dimethyl-p-toluidine in a solvent is sprayed onto a substrate to form a base coat. An acrylic monomer having a glycidyl group, such as glycidyl methacrylate, and an organic peroxide, is then applied. The outer coating hardens within about 10 minutes, complete cure being effected by heating.

Pretreatment of a substrate with a hardener for a photosensitive layer is described in U.S. Pat. No. 4,241,171. A carrier is coated with a hardener for gelatin, typically succinaldehyde, and this is then coated with a barrier layer. A photographic emulsion is then applied and during drying the hardener diffuses through the barrier layer and crosslinks the gelatin in the photographic emulsion. Further hardening of the photosensitive layer does not occur. Exposure to light affects the photosensitive elements in that layer but not its overall hardness. Contact with a developer does not remove unexposed portions of the layer and hence does not give rise to the formation of a three-dimensional image on the carrier.

In none of the aforementioned patents is there disclosed a process in which the initial polymerisation is effected to leave a surface that is still soluble in certain solvents, and complete insolubility is achieved by irradiation—thus enabling image formation to take place.

Accordingly, this invention provides a process for the production of an image which comprises
(a) applying to a substrate a polymerising agent,
(b) applying to the said polymerising agent on the substrate a layer of a liquid composition containing a residue that is polymerisable on contact with the polymerising agent, and a photocurable residue, such that the layer solidifies but remains photocurable,
(c) exposing the solidified layer to actinic radiation in a predetermined pattern such that exposed parts of the layer are photocured, and
(d) removing those parts of the layer which have not become substantially photocured by treatment with a solvent therefor.

The phrase "exposing in a predetermined pattern" includes both exposure through an image-bearing transparency and exposure to a laser beam moved as directed by a computer to form an image.

The liquid composition that is applied to the polymerising agent on the substrate in stage (b) of the new process may contain a substance having the polymerisable and the photocurable groups on the same molecule, or it may comprise a mixture of one or more materials that are polymerisable on contact with the polymerising agent, together with one or more photocurable materials.

The polymerisable residues may themselves comprise a single species or two or more similar species which polymerise under the catalytic influence of the polymerising agent, or they may comprise two or more coreacting species that are comparatively stable until reaction between them is catalysed or accelerated by the polymerising agent.

The polymerising agent is a substance that either initiates or catalyses polymerisation of a single species, or the copolymerisation of two or more similar species, or acts as a catalyst or accelerator for a polymer-forming reaction between two or more co-reactants. Such materials may be neutral, basic, or acidic, their selection depending upon the nature of the material to be polymerised.

Suitable polymerisable residues and their polymerising agents include the following: cyanoacrylates with water, aqueous ammonium hydroxide solution, an aqueous alkali metal hydroxide solution, or an amine; mixtures of polyols and isocyanates with aqueous ammonium hydroxide solution, an aqueous alkali metal hydroxide solution, or an amine; isocyanate-terminated prepolymers with water, aqueous ammonium hydroxide solution, an aqueous alkali metal hydroxide solution, or an amine; polyene-polythiol mixtures with aqueous ammonium hydroxide solution, an aqueous alkali metal hydroxide solution, or an amine; epoxy resins with a boron trifluoride or boron trichloride complex, a boron difluoride chelate, dicyandiamide, an imidazole, or amine, or an acid anhydride; epoxy resin-amine mixtures with an acid, an aqueous acid solution, an acid salt solution or with a metal perchlorate, trifluoromethanesulphonate, trihalocarboxylate or nitrate known as an accelerator for epoxy resin-amine reactions; epoxy resin-thiol mixtures with an aqueous-ammonium hydroxide solution or an amine; phenolic resins with an acid or an aqueous acidic solution, and mixtures of an acrylate or methacrylate and a peroxide initiator with an accelerator for the peroxide such as an amine or a Schiff's base or a transition metal or its salt.

When the polymerising agent effects polymerisation of the polymerisable residue only upon heating, the substrate is heated after application of the liquid composition.

Preferred amines that may be used as the polymerising agent include trimethylamine, diethylamine, triethylamine, propylamines, butylamines, octylamines, N,N-dimethyl octylamines, isophorone diamine, and aromatic amines such as phenylenediamines. Suitable Schiff's bases include those formed by reaction of an aliphatic diamine or polyamine with an aliphatic aldehyde or ketone, such as those formed by reaction of ethylenediamine, diethylenetriamine, or triethylene tetramine, with acetaldehyde, acetone, or methylisobutyl ketone. Suitable acids and acidic solutions include hydrochloric acid, sulphuric acid, toluene-p-sulphonic acid, methane sulphonic acid and sulphamic acid. Suitable metal perchlorates, trifluoromethanesulphonates, trihalocarboxylates and nitrates are described in U.S. Pat. Nos. 4,026,858, 4,101,459, 4,115,296 and 4,130,511 respectively.

Suitable boron trichloride complexes are those with tertiary amines such as trimethylamine, octyldimethylamine and others disclosed in U.S. Pat. No. 3,784,647. Boron trifluoride complexes that may be used include those with a triaryl phosphine, with piperidine, or with a primary amine, especially triphenylphosphine, isophoronediamine, ethylamine, benzylamine, cyclohexylamine and tetramethylhexamethylenediamine. Suitable boron difluoride chelates include difluoroboron-2-hydroxyacetophenone, difluoroboronacetoacetanilide and other such chelates described in U.S. Pat. No. 3,424,699. Suitable imidazoles include 2-methylimidazole, 2-phenylimidazole, 1-benzyl-2-methylimidazole, and 1-cyanoethyl-2-methylimidazole. Transition metals and their salts that may be used include cobalt, nickel and iron, present in colloidal form or as their organic solvent-soluble salts with organic acids, such as their naphthenates, octanoates and laurates.

Suitable cyanoacrylates that may be used in the process of this invention include those of formula I

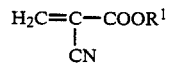

in which $R^1$ has, at most, 18 carbon atoms and is an alkyl, alkenyl, aralkyl, haloalkyl, cycloalkyl, aryl or alkoxyalkyl group, especially a methyl, ethyl, allyl, benzyl, chloromethyl, cyclohexyl, phenyl, or ethoxyethyl group.

Mixtures of polyols and isocyanates that may be used include diols, for example alkylene glycols such as ethylene glycol, 1,4-butanediol and bis(hydroxymethyl)cyclohexane, and polyoxyalkylene glyols such as polyoxyethylene and polyoxypropylene glycols having molecular weights from 200 to 5000, triols, for example glycerol, other alkane triols and polyoxyethylene and polyoxypropylene triols having molecular weights from 400 to 4000, hydroxy group-containing reaction products of an epoxy resin with any material having groups that are reactive with epoxide groups, such as carboxylic acid, carboxylic anhydride, phenolic hydroxyl, primary or secondary amino, and thiol groups, pentaerythritol and hydroxy group-containing polymers, such as polymers of hydroxyalkyl acrylates and methacrylates and copolymers of styrene and allyl alcohol; with aliphatic, cycloaliphatic and aromatic isocyanates such as hexamethylene diisocyanate, phenylene diisocyanate, toluene diisocyanates, diphenylenemethane diisocyanates, dicyclohexylmethane diisocyanates, naphthylene diisocyanates, and isocyanate-terminated prepolymers formed by reaction of a polyol, polyamine, or polycarboxylic acid with such a diisocyanate. Suitable isocyanate group-containing adducts are described in, for example, U.S. Pat. No. 4,173,682. Such isocyanate-terminated prepolymers may also be polymerised by the action of ammonia or an amine in the absence of any added polyol, as described, for example, in British Patent Application No. 2 093 046.

Suitable polyene-polythiol mixtures are described in British Patent Specification No. 1 293 722. The polyenes usually have a molecular weight of 50 to 20,000 and contain two or more ethylenic or ethynylic bonds capable of participating in a free-radical polymerisation reaction. Preferred polyenes include the reaction product of 1 mole of tolylene diisocyanate with 2 moles of a dialkenyl ether of trimethylol propane, the reaction product of 1 mole of a polymeric diisocyanate with 2 moles of allyl alcohol, the reaction product of 1 mole of polyethylene glycol with 2 moles of tolylene-2,4-diisocyanate and 2 moles of allyl alcohol, polyisoprene, polybutadiene and other unsaturated polymers in which the unsaturation occurs primarily within the main chain of the molecules, compounds having reactive unsaturated carbon to carbon bonds conjugated with adjacent unsaturated groupings, such as polyethylene ether glycol diacrylate, having a molecular weight of about 750, polytetramethylene ether glycol dimethacrylate having a molecular weight of about 1175, and the triacrylate of the reaction product of trimethylolpropane with 20 moles of ethylene oxide, and reaction products of polyepoxides with amines, alcohols, thioalcohols, or acids having aliphatic unsaturation, such as the reaction product of bisphenol A diglycidyl ether with allylamine or diallylamine.

Suitable polythiols usually have a molecular weight within the range 50-20,000, especially 100-10,000, esters of thioglycolic, alpha mercaptopropionic acid, and beta mercaptopropionic acid with glycols, triols, tetraols, pentaols, or hexols being preferred. Specific examples of the preferred polythiols are ethylene glycol bis(thioglycollate), ethylene glycol bis(beta mercaptopropionate), trimethylolpropane tris(beta mercaptopropionate), pentaerythritol tetrakis (beta mercaptopropionate), and tris(hydroxyethyl)isocyanurate tris(beta mercaptopropionate). Suitable polyene-polythiol mixtures are further described in British Patent Specification No. 1 293 722.

Epoxy resins that may be used in the new process are preferably those containing at least two groups of formula

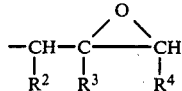

II directly attached to an atom or atoms of oxygen, nitrogen, or sulphur, where either $R^2$ and $R^4$ each represent a hydrogen atom, in which case $R^3$ denotes a hydrogen atom or a methyl group, or $R^2$ and $R^4$ together represent $-CH_2CH_2-$, in which case $R^3$ denotes a hydrogen atom.

As examples of such resins may be mentioned polyglycidyl and poly(beta-methylglycidyl) esters derived from aliphatic or aromatic polycarboxylic acids, and polyglycidyl and poly(betamethylglycidyl) ethers derived from compounds containing at least two free alcoholic or phenolic hydroxyl groups. Poly(N-glycidyl) derivatives of amines and poly(S-glycidyl) compounds may also be used. Specific preferred epoxide resins are polyglycidyl ethers of 2,2-bis(4-hydroxyphenyl)propane, of bis(4-hydroxyphenyl)methane, or of a novolak formed from formaldehyde and phenol, or phenol substituted in the ring by one chlorine atom or by one alkyl hydrocarbon group containing from one to nine carbon atoms, and having 1,2-epoxide content of at least 0.5 equivalent per kilogram, bis(4-diglycidylamino)methane, and p-(diglycidylamino)phenyl glycidyl ether.

Epoxide resins in which some or all of the epoxide groups are not terminal may also be employed, particularly cycloaliphatic epoxide resins such as vinylcyclohexene dioxide, limonene dioxide, dicyclopentadiene dioxide, 4-oxatetracyclo[6.2.1.0$^{2,7}$.0.$^{3,5}$]undec-9-yl glycidyl ether, 1,2-bis(4-oxatetracyclo[6.2.1.0$^{2,7}$.0.$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexyl)-8,9-epoxy-2,4-dioxaspiro[5,5]undecane, and epoxidised butadienes or copolymers of butadienes with ethylenic compounds such as styrene and vinyl acetate.

Epoxy resin-thiol mixtures that may be used in the present process are preferably mixtures of those epoxy resins and polythiols that are described above. Amines suitable for use in epoxy resin-amine mixtures in the present process may be primary, secondary or tertiary and may be aliphatic, alicyclic, unsaturated heterocyclic, aromatic or araliphatic amines, typically N,N,N',N'-tetramethyl ethylene, propylene, or butylene diamines, trialkyl monoamines such as triethylamine, trialkanolamines such as triethanolamine, N,N'-dimethylpiperazine, triethylenediamine, hexamethylenetetramine, pyridine, quinoline, benzyldimethylamine, 2,4,6-tris(dimethylaminomethyl)phenol, aromatic diamines such as 4,4'-diaminodiphenylmethane, 3-ethyl-4,4'-diaminodiphenylmethane and 3,3'-diethyl-4,4'-diaminodiphenylmethane.

Phenolic resins that may be used in the process of this invention are resoles made from a phenol, particularly phenol itself, and an aldehyde, usually formaldehyde.

Acrylate and methacrylate monomers that may be admixed with the accelerator for peroxide-initiated polymerisation and polymerised by contact with a peroxide free radical initiator include acrylic and methacrylic acids, alkyl acrylates such as methyl and ethyl acrylates, alkylene diol acrylates such as ethylene and propylene glycol diacrylates, 1,1,1-trimethylol propane triacrylate, polypropylene glycol diacrylate, allyl acrylate, acrylate esters of epoxides or phenolic resoles, and the corresponding methacrylates. Suitable peroxide initiators include hydrogen peroxide, tert.butyl hydroperoxide, cumene hydroperoxide, and 2,4-dimethyl-2,4-hexanedihydroperoxide.

Photocurable residues that may be present include both those in which cure is effected by direct activation of photosensitive groups through irradiation and those in which the irradiation activates a suitable initiator molecule which then activates photopolymerisable groups.

Materials having photosensitive groups are well known and include those having at least two, and preferably three or more, groups which are azido, coumarin, stilbene, maleimido, pyridinone, chalcone, propenone, pentadienone, anthracene, or acrylic ester groups which are substituted in their 3-position by a group having ethylenic unsaturation or aromaticity in conjugation with the ethylenic double bond of the acrylic group.

Materials in which photocure is effected by activation of a photoinitiator which then activates polymerisable groups include epoxide resins, phenolic resins, urea-formaldehyde resins, cyclic ethers, cyclic esters, cyclic sulphides, cyclic amines and organosilicon cyclics in combination with a radiation-sensitive aromatic onium salt, such as diazonium, sulphonium, iodonium, and sulphoxonium salts, or a radiation-sensitive aromatic iodosyl salt, and full and partial esters of acrylic and methacrylic acid with aliphatic monohydric alcohols, glycols and higher functional polyols or with a compound containing one or more glycidyl groups, and esters formed by reaction of a polyepoxide with an adduct of a hydroxyalkyl acrylate or methacrylate with a saturated or unsaturated polycarboxylic acid anhydride.

Examples of suitable azides are those containing at least two groups of formula $N_3R^5-$  III where $R^5$ denotes a mononuclear or dinuclear divalent aromatic radical containing in all from 6 to at most 14 carbon atoms, especially a phenylene or naphthylene group.

Examples of suitable coumarins are those containing groups of the formula

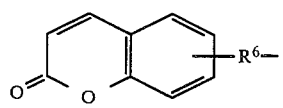 IV where $R^6$ is $-O-$, $-COO-$, $-SO_2-$, or $-SO_2O-$.

Examples of stilbenes are those with groups of formula

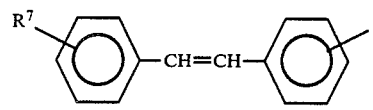 V where $R^7$ is the residue, containing up to 8 carbon atoms in all of a five or six-membered nitrogen-containing heterocyclic ring fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

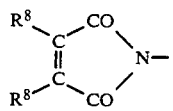 VI where each $R^8$ is an alkyl group of 1 to 4 carbon atoms, a chlorine atom, or a phenyl group, and especially a methyl group.

Examples of those containing pyridinone units are those having groups of the formula

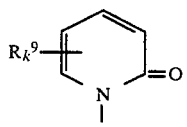 VII where
$R^9$ is an aliphatic or cycloaliphatic radical of 1 to 8 carbon atoms and
k is zero or an integer of 1 to 4.

Examples of compounds containing chalcone, propenone, and pentadienone groups are those containing groups of formula

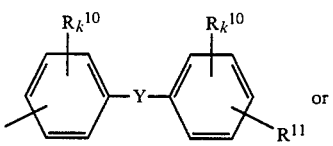 or

VIII

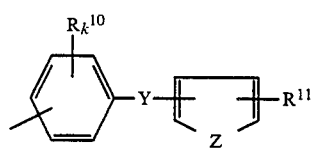

IX where
each $R^{10}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulphonic, or phosphoric acid group in the form of a salt, k has the meaning previously assigned, $R^{11}$ represents a valency bond or a hydrogen atom, Y represents a grouping of formula

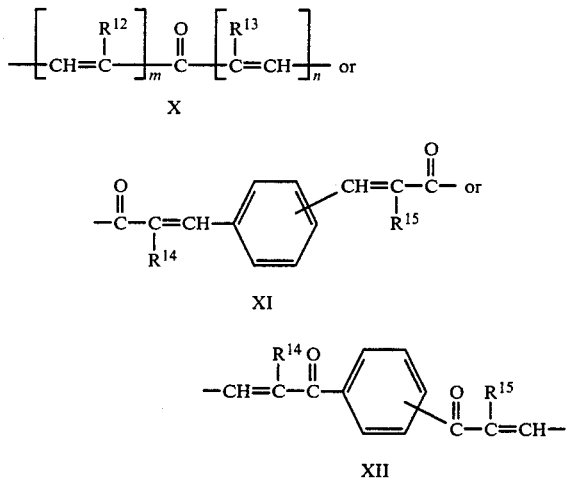

$R^{12}$ and $R^{13}$ are each individually a hydrogen atom, an alkyl group, e.g. of 1 to 4 carbon atoms, or an aryl group, preferably a mononuclear group such as a phenyl group, or $R^{12}$ and $R^{13}$ conjointly denote a polymethylene chain of 2 to 4 methylene groups, $R^{14}$ and $R^{15}$ are each a hydrogen atom, an alkyl group, e.g., of 1 to 4 carbon atoms, or an aryl group which is preferably a mononuclear group such as a phenyl group, m and n are each zero, 1, or 2, with the proviso that they are not both zero, and Z is an oxygen or sulphur atom.

Suitable anthracenes are those containing anthryl groups, such as 1-, 2-, or 9-anthryl groups, which are unsubstituted or have one or two bromo, chloro, methyl or nitro substituents.

Suitable 3-substituted acrylates contain groups of the general formula

 XIII where
$R^{16}$ is an aliphatic or mononuclear aromatic, araliphatic, or heterocyclic group which, as already indicated, has ethylenic unsaturation or aromaticity in conjugation with the ethylenic double bond shown, such as phenyl, 2-furyl, 2- or 3-pyridyl, prop-2-enyl, or styryl groups, and $R^{17}$ is a hydrogen, chlorine or bromine atom or an alkyl group of from 1 to 4 carbon atoms.

Specific examples are disorbates of poly(oxyalkylene) glycols, polyvinyl cinnamate and epoxide resin-cinnamic acid reaction products.

Onium salts which, when combined with an epoxide resin or other cationically polymerisable substance, give photopolymerisable mixtures, are described in U.S. Pat. Nos. 4,058,400 and 4,058,401. Suitable sulphoxonium salts that may be used for the same purpose are disclosed in U.S. Pat. Nos. 4,299,938, 4,339,567 and 4,383,025. Other onium salts that may be used include monoaryl iodonium salts.

Suitable aromatic iodosyl salts which, when combined with a cationically polymerisable substance, give a photopolymerisable mixture, are those of formula $((Ar^1)(Ar^2)I+O)_t X^{t-}$, where $Ar^1$ and $Ar^2$, which can be the same or different, each represent a monovalent aromatic radical of 4 to 25 carbon atoms, $X^{t-}$ denotes a t-valent anion of a protic acid, and t denotes 1, 2 or 3.

Preferably $Ar^1$ and $Ar^2$ are each phenyl, optionally substituted on each of the phenyl rings by an alkyl group of 1 to 4 carbon atoms, a halogen atom or a nitro group. The anion $X^{t-}$ is selected to give effective curing. Matching a cationically polymerisable material with a suitable anion is well within the knowledge of those skilled in the art of curing or polymerising cationically polymerisable compositions. For example, salts containing anions derived from organic carboxylic acids, organic sulphonic acids, and inorganic acids, especially acetates, trifluoroacetates, methanesulphonates, benzene-sulphonates, toluene-p-sulphonates, trifluoromethanesulphonates, fluorides, chlorides, bromides, iodates, perchlorates, nitrates, sulphates, hydrogen sulphates, phosphates or hydrogen phosphates are useful in curing phenoplasts, such as phenol-formaldehyde resins, and aminoplasts, such as urea-formaldehyde resins. Salts containing a pentafluorohydroxoantimonate anion or a metal halogenide or metalloid halogenide anion of formula $MQ_w^-$, where M represents an atom of a metal or metalloid, Q represents a halogen atom, w is an integer of from 4 to 6 and is one more than the valency of M, are useful in curing epoxide resins or episulphide resins.

Preferred anions of formula $MQ_w^-$ are hexafluoroantimonate, hexachloroantimonate, hexafluoroarsenate, tetrachloroferrate, hexachlorostannate, tetrafluoroborate or hexafluorophosphate, the two last-named being especially preferred.

The iodosyl salts may be prepared by methods similar to, or analogous to, those described by F. M. Beringer and P. Bodlaender, J. Org. Chem. 1968, 33, 2981–4.

Full and partial esters of acrylic and methacrylic acid that may be used as the photocurable residue in the present process contain at least one group of formula

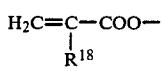 XIV where
$R^{18}$ denotes a hydrogen atom or a methyl group.

Preferably these are esters of glycols, such as ethylene glycol, triethylene glycol, and tetraethylene glycol, and esters formed by reaction of acrylic or methacrylic acid with a mono- or poly-glycidyl ether of a mono- or poly-hydric alcohol or phenol or an N-glycidylhydantoin. Other suitable esters are formed by reaction of an adduct of a hydroxyalkyl acrylate or methacrylate and an anhydride, especially succinic, maleic, or phthalic anhydride, with an epoxy resin. Typical esters include 1,4-bis(2-hydroxy-3-acryloyloxypropoxy)butane, a poly(2-hydroxy-3-acryloyloxypropyl)ether of a phenol formaldehyde novolak, 2,2-bis(4-(2-hydroxy-3-(2-acryloyloxyethoxy)-succinyloxypropoxy)phenyl)propane, 1-(2-hydroxy-3-acryloyloxypropoxy)-butane, -octane, and -decane, bis(2-hydroxy-3-acryloyloxypropyl)adipate, 2-hydroxy-3-acryloyloxypropyl propionate, and 3-phenoxy-2-hydroxypropyl acrylate, and the corresponding methacrylates.

As indicated above, the polymerisable group or groups and the photocurable group or groups may form part of the same molecule. For example, epoxides or phenolic resoles containing photocurable groups can be used in embodiments of the invention described above which utilise an epoxide or a phenolic resole respectively, and hydroxyl-substituted compounds containing a photocurable group can be used in embodiments utilising a mixture of a polyol and an isocyanate. In some instances, for example where materials containing epoxide, acrylate or methacrylate groups are used, the same type of group may provide both the polymerisable and photocurable residues, the solidified layer obtained in step (b) containing sufficient uncured material to be imagewise photocured in step (c).

Suitable such dual-functional materials may be made by introducing one or more ethylenically unsaturated groups, such as acrylic, methacrylic or cinnamic ester groups or chalcone groups, into a compound that contains one or more polymerisable groups such as epoxide groups, or one or more groups that will react with a different reactive group on another molecule to form a polymer, such as mercapto or hydroxyl groups. Such introduction of ethylenically unsaturated groups may be effected by ester formation using, for example, acrylic, methacrylic or cinnamic acid or a chalcone group-containing carboxylic acid and a hydroxyl or mercapto group-containing compound or an epoxide in such proportions that the product contains at least one unreacted hydroxyl, mercapto or epoxide group. Of course, where acrylic, methacrylic or cinnamic acid is reacted with an epoxide resin, all of the epoxide groups of the resin can be reacted, the hydroxyl groups formed by opening of the epoxide rings providing the reactive hydroxyl functionality for use in the process of this invention.

Other suitable dual-functional materials include hydroxy-substituted chalcones, hydroxyphenyl-substituted propenones and pentadienones, hydroxy-substituted maleimides and hydroxy-substituted pyridinones. Especially preferred dual functional materials include epoxy-substituted chalcones, propenones and pentadienones, especially glycidyl ethers of phenols containing a chalcone, propenone or pentadienone group, or reaction products of bisphenols containing such a group with an epoxide resin; glycidyl acrylate, glycidyl methacrylate, and acrylate, methacrylate and cinnamate group-containing ethers and esters of phenolic resoles and epoxide resins, including fully reacted products of acrylic, methacrylic, and cinnamic acids with epoxide resins such as polyglycidyl ethers of polyhydric alcohols and phenols and partial products of these reactants, such as 2-(4-glycidyloxyphenyl)-2-(4-(3-acryloyloxy-2-hydroxypropoxy)-phenyl)propane, 2-(4-glycidyloxyphenyl)-2-(4-(2-hydroxy-3-methacryloyloxy)propoxy)-phenyl)propane, 1-glycidyloxy-4-(3-acryloyloxy-2-hydroxypropyloxy)butane and 1-glycidyloxy-4-(2-hydroxy-3-methacryloyloxypropyloxy)-butane.

It will be appreciated that some of the materials suggested for inclusion in the liquid composition may be solid. Where necessary, the conventional method of adding a non-volatile diluent may be used to give a liquid composition of practicable viscosity. For instance, where a solid acrylate is used, a low molecular weight liquid acrylate such as a hydroxyalkyl acrylate or lower alkylenediol acrylate may be added to give a liquid composition of practicable viscosity.

In specific especially preferred embodiments of the process of the invention, the polymerisable residue, and its polymerising agent are selected from:

a cyanoacrylate of formula I in which $R^1$ is an alkyl group of 1 to 8 carbon atoms, with water, a mixture of a dual-functional hydroxyl group-containing reaction product of an epoxide resin with acrylic or methacrylic acid and a diisocyanate, with an aromatic primary amine, an epoxide resin containing at least two groups of formula II with a boron difluoride chelate, a mixture of an epoxide resin having at least two groups of formula II and an aromatic primary diamine, with a metal nitrate accelerator, a dual functional reaction product of acrylic or methacrylic acid and a phenolic resole made from phenol and formaldehyde, with an acid, a mixture of a peroxide initiator and an acrylate or methacrylate of an alkylenediol or trimethylolpropane, a hydroxyalkyl acrylate or methacrylate or a reaction product of acrylic or methacrylic acid and a polyglycidyl ether of a polyhydric alcohol or phenol, with a transition metal salt accelerator, or a mixture of a peroxide initiator and a dual-functional reaction product of acrylic or methacrylic acid and a phenolic resole made from phenol and formaldehyde, with a transition metal salt accelerator.

The photocurable residue in specific especially preferred embodiments is selected from:

an epoxide resin obtained by advancement with a bisphenol of a diglycidyl ether of a bisphenol containing a pentadienone group, a cycloaliphatic epoxide resin in combination with a radiation-sensitive aromatic onium salt, methylol groups in a dual-functional reaction product of acrylic or methacrylic acid and a phenol-formaldehyde resole, in combination with a radiation-sensitive aromatic onium salt, acrylate or methacrylate groups in a dual-functional reaction product of acrylic or methacrylic acid and a phenolformaldehyde resole, an acrylate or methacrylate of an alkylene diol or 1,1,1-trimethylolpropane, or a reaction product of acrylic or methacrylic acid and a polyglycidyl ether of a polyhydric alcohol or phenol.

In order to obtain the best possible images by the new process, it is preferred that the polymerisation stage and the photocuring stage are effected through different chemical processes. Therefore, for example, when the first stage is carried out by contact between a phenolic resin and an acid, the second stage should preferably not involve reaction of a phenolic resin with an acid liberated as a result of irradiation of an initiator molecule.

The method by which the polymerising agent is applied is not critical. It may be applied by spraying, dipping, brushing, spin-coating, or any other known coating method, using a solution or suspension in water or an organic solvent where the agent is not a liquid.

Photocuring may be effected by radiation in the presence of a suitable catalyst. Like the photocurable compounds, the catalysts fall into two main classes:

(i) those which, on irradiation, give an excited state that leads to formation of free radicals which then initiate curing of the monomer (photoinitiators) and (ii) those which, on irradiation, give an excited state that in turn transfers its excitation energy to a molecule of the monomer, giving rise to an excited molecule of the monomer which then crosslinks with an unexcited molecule of the monomer (photosensitisers).

The first class includes organic peroxides and hydroperoxides, alpha-halogen substituted acetophenones, benzoin and its alkyl ethers, alpha-methylbenzoin, benzophenones, O-alkoxycarbonyl derivatives of an oxime of benzil or of 1-phenylpropane-1,2-dione, benzil ketals, e.g. its dimethyl ketal, substituted thioxanthones, e.g. 2-chlorothioxanthone and 2-isopropylthioxanthone, anthraquinones, and mixtures of phenothiazine dyes or quinoxalines with electron donors, these initiators being used with unsaturated esters, especially acrylates and methacrylates.

The second class includes 5-nitroacenaphthene, 4-nitroaniline, 2,4,7-trinitro-9-fluorenone, 3-methyl-1,3-diaza-1,9-benzanthrone, and bis(dialkylamino)benzophenones, especially Michler's ketone, i.e., 4,4'-bis(-dimethylamino)benzophenone.

Suitable carriers on which the liquid composition may be polymerised and cured in accordance with this invention are metals, particularly copper and aluminum, fibre reinforced composites, optionally faced with a metal, and silicon wafers.

In the third stage of the process, actinic radiation of wavelength 200-600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual compounds used, the proportion of these compounds in the composition, the type of light source, and its distance from the composition. Suitable times may be readily determined by those familiar with photocuring techniques.

After irradiation, those parts not exposed are washed away by means of a solvent such as cyclohexanone, 2-ethoxyethanol, toluene, acetone, and mixtures thereof and aqueous acids and bases such as dilute hydrochloric acid, aqueous sodium carbonate or sodium hydroxide. Thus, the compositions of this invention may be used in the production of printing plates and printed circuits. Methods of producing printing plates and printed circuits from photocurable compositions are well known.

The following Examples illustrate the invention. All parts and percentages are by weight, unless stated otherwise.

The resins used in these Examples are prepared as follows:

RESIN I 2,2-Bis(4-glycidyloxyphenyl)propane, having an epoxide content of 5.1 equivalents/kg (100 g), and 2,6-di-tert.butyl-4-methylphenol (0.1 g) are stirred together and heated to 100° C. To this mixture there is added slowly, over 1½ hours, a mixture of acrylic acid (19.1 g), chromium (III) tris octanoate (0.05 g) and 2,6-di-tert.butyl-4-methylphenol (0.2 g). On complete addition the mixture is stirred at 100° C. for a further 7 hours and cooled. The product has a negligible epoxide content.

RESIN II

A mixture is prepared containing 80% phenol (20.84 parts), formalin solution (38.3% formaldehyde; 22.22 parts), and zinc acetate (1.94 parts) and this is heated under reflux for 2½ hours. The solution is cooled and the aqueous phase separated, leaving 22.35 parts of a phenolic resole. This is washed with saturated brine, and then twice with water. The resole had a viscosity at 25° C. of 3.15 Pa s.

This resole (20 parts) is mixed with tetramethylammonium chloride (0.04 part) and 2,6-di-tert.butyl-4-methylphenol (0.055) and heated to 80° C. Glycidyl methacrylate (7.37 parts) is added over 1 hour and, on complete addition, heating is continued for 10¾ hours. The product, a 3-methacryloyl-2-hydroxypropylether of a phenolic resole, has a viscosity of 25° C. at 14.75 Pa s, and a negligible epoxide content.

RESIN III

A 2,2-bis(4-hydroxyphenyl)propane-based epoxy resin having an epoxide content of 1.6 equivalents/kg (100 g) and 2,6-di-tert.butyl-4-methylphenol (0.1 g) are heated until molten, stirred together and heated to 130° C. To this mixture there is slowly added, over 30 minutes, a mixture of acrylic acid (10.7 g), chromium (III) tris octanoate (0.05 g) and 2,6-di-tert.butyl-4-methylphenol (0.2 g). On complete addition the mixture is stirred at 130° C. for a further 2 hours and cooled. The product has a negligible epoxide content.

RESIN IV 1,5-bis(4-glycidyloxyphenyl)-1,4-pentadien-3-one (200 g), 2,2-bis(3,5-dibromo-4-hydroxyphenyl) propane (76.4 g), 2,2-bis(4-hydroxyphenyl) propane (54.6 g), tetraethylammonium bromide (0.1 g), 1,4-butanediol dimethacrylate (221 g), and 2,6-di-tert.butyl-4-methylphenol (0.264 g) are mixed together and heated at 100° C. for 24 hours. 2-Hydroxyethyl methacrylate (110 g) is added to give a mixture having 50% resin solids content, and epoxide content of 1.12 equivalents/kg (calculated on 100% resin solids), and a viscosity at 25° C. of 38.5 Pa s.

EXAMPLE 1

A clean copper plate is moistened with a very fine spray of water in a quantity that is insufficient for individual droplets to be observed on the surface. A mixture containing ethyl 2-cyanoacrylate (10 parts), Resin I (5 parts) and benzil dimethyl ketal (0.3 part) is applied to the surface as a layer 20 μm thick. After 5 minutes the coating is tack-free. Irradiation through a negative for 2 minutes, using a 5000 w medium pressure mercury halide lamp at a distance of 75 cm followed by development in a 9:1 toluene-acetone mixture gives a good image.

EXAMPLE 2

A precleaned copper clad laminate is coated with a 25% ethanolic solution of p-toluene sulphonic acid and allowed to dry. Resin II is mixed with 2% benzil dimethyl ketal and the resultant clear mixture is applied as a layer 20 μm thick to the above pretreated copper clad laminate and left at ambient temperature for 16 hours, to give a tack-free coating. The solidified coating is irradiated through a negative for 1 minute using a 5000 w metal halide lamp at a distance of 75 cm. Development

EXAMPLE 3

A mixture of Resin IV (10 parts), cumene hydroperoxide (0.3 part), and o-benzoic sulphimide (0.025 part) is prepared. A precleaned copper clad laminate is coated with Accelerator VN2, and allowed to dry. This material is a commercial accelerator for peroxides comprising a transition metal salt solution in an alcoholic solvent available from Akzo Chemie U.K. Ltd., Wandsworth, London S.W.18. The above mixture is then coated onto the board and the coating is left at ambient temperature for 16 hours, by which time it has become tack-free. The solidified coating is irradiated through a negative for 2 minutes using a 5000 w metal halide lamp at a distance of 75 cm. Development with cyclohexanone at 25° C. for 1 minute gives an image.

EXAMPLE 4

Resin I (10 parts) is mixed with a mixture (4 parts) of 2,4-di-isocyanatotoluene (80%) and 2,6-di-isocyanatotoluene (20%) and benzil dimethyl ketal (0.1 part). A precleaned copper clad laminate is coated with a 30% solution of m-phenylenediamine in acetone and allowed to dry. The above mixture is then coated onto the laminate and the laminate placed in a dry atmosphere at ambient temperature for 8 hours. The solidified coating is irradiated through a negative for 1 minute using a 5000 w metal halide lamp at a distance of 75 cm. Development with toluene at 25° C. for 1 minute gives a good image.

EXAMPLE 5

A composition is prepared containing 2,2-bis(4-glycidyloxyphenyl)propane (5 parts), phenyl glycidyl ether (5 parts), a mixture of aromatic diamines comprising approximately 50% of 4,4'-diaminodiphenylmethane, the remainder being 3-ethyl-4,4'-diaminodiphenylmethane, and 3,3'-diethyl-4,4'-diaminodiphenylmethane (3.2 parts), Resin I (10 parts) and benzil dimethyl ketal (0.1 part). This formulation is coated onto a cleaned aluminum plate, which is pretreated with a 50% solution of lanthanum nitrate hexahydrate in 2-methoxyethanol. The coating becomes tack-free within 30 minutes. Irradiation through a negative using a 5000 w metal halide lamp at a distance of 75 cm for 1 minute, followed by development in a 1:1 by volume mixture of toluene and acetone gives a good image.

EXAMPLE 6

Example 5 is repeated, replacing the aluminum plate by a copper plate. A good image is obtained.

EXAMPLE 7

An epoxy resin-glass fibre laminate board is treated with, as polymerising agent, a solution of iron naphthenate in ligroin (containing 6% Fe) and allowed to dry. This is then coated with a mixture containing Resin II (10 parts), cumene hydroperoxide (0.3 part), o-benzoic sulphimide (0.025 part), and phenyl (2,6-dimethyl-4-oxo-4H-pyran-3-yl)iodonium tosylate (0.5 part; prepared from equimolar amounts of 2,6-dimethyl gamma pyrone and phenyliodoso tosylate by mixing these at room temperature in chloroform and precipitating the product with excess petroleum ether). The coating solidifies within 24 hours at room temperature and is then irradiated for 5 minutes under a 5000 w metal halide lamp at a distance of 75 cm. Development in a 9:1 by volume mixture of toluene and acetone gives an image.

EXAMPLE 8

A glass fibre-epoxy resin laminate is treated with, as polymerising agent, a solution of iron naphthenate in ligroin (containing 6% Fe) and allowed to dry. On this is coated a mixture containing 3,4-epoxy cyclohexyl methyl 3',4'-epoxycyclohexane carboxylate having an epoxide content of 7.3 eq/kg (30 parts), 2,2-bis(4-glycidyloxyphenyl)propane having an epoxide content of 5.1 eq/kg (30 parts), Resin I (30 parts), trimethylol propane trismethacrylate (10 parts), cumene hydroperoxide (3 parts) and diphenyl iodonium hexafluorophosphate (5 parts). This is allowed to dry at 30° C. for 2 hours to give a tack-free film. The solidified coating is irradiated through a negative for 5 minutes using a 5000 w metal halide lamp at a distance of 75 cm. Development with ethanol at 25° C. for 1 minute gives an image.

EXAMPLE 9

A solution in acetone of boron difluoride-2-hydroxyacetophenone chelate is brushed onto a copper-clad laminate and allowed to dry at ambient temperature. The following mixture is then applied as a coating 30 micrometers thick: Resin III (20 parts), butanediol diglycidyl ether (15 parts), n-butylglycidyl ether (5 pbw), benzil dimethyl ketal (1.2 parts). After being left for 1 hour at ambient temperature the coating is tack-free.

The solidified coating is irradiated through a negative for 2 minutes using a 5000 w metal halide lamp at a distance of 75 cm. Development with cyclohexanone gives an image.

The chelate solution used as polymerising agent in this example is prepared as follows:

Boron trifluoride-diethyl ether complex (100 g) in toluene (250 ml) is heated slowly until distillation commences. Whilst maintaining this distillation, 2-hydroxyacetophenone (98 g) is added dropwise over 1 hour, and the distillation is continued until evolution of hydrogen fluoride ceases. The solution is then cooled and crystals of the chelate are filtered off. The chelate is dissolved in the minimum quantity of acetone, at ambient temperature.

EXAMPLE 10

A solution of N,N'''-bis(1-(2-butyl)ethylidene)3,6-diazaoctane-1,8-diamine in methylisobutyl ketone is brushed onto a copperclad laminate and allowed to dry at ambient temperature. The following mixture is then applied as a coating 50 micrometers thick:

Resin III (20 parts), trimethylolpropane trismethacrylate (5 parts), 2-hydroxyethyl methacrylate (5 parts), benzil dimethyl ketal (0.9 part), and cumene hydroperoxide (0.9 part). After being left overnight at ambient temperature the coating is tack-free.

The solidified coating is irradiated through a negative for 2 minutes using a 5000 w metal halide lamp at a distance of 75 cm. Development with a 70:30 by volume mixture of toluene and acetone gives an image.

The solution of Schiff's base used as polymerising agent in this example is prepared as follows:

3,6-Diazaoctane-1,8-diamine (14.6 g) and methylisobutyl ketone (40.0 g) in toluene (250 ml) are heated at reflux under a Dean and Stark trap until the required quantity of water (3.6 ml) is evolved. The toluene is then removed by distillation.

What is claimed is:

1. A process for the production of an image which comprises
   (a) applying to a substrate a polymerizing agent,
   (b) applying to the polymerizing agent on the substrate a layer of a liquid composition containing a residue that is polymerizable on contact with the polymerizing agent, and a photocurable residue, such that the layer solidifies but remains photocurable,
   (c) exposing the solidified layer to actinic radiation in a predetermined pattern such that exposed parts of the layer are photocured, and
   (d) removing those parts of the layer which have not become substantially photocured by treatment with a solvent therefor.

2. A process according to claim 1, in which the liquid composition comprises a substance having polymerizable and photocurable groups on the same molecule.

3. A process according to claim 1, in which the liquid composition comprises a mixture of one or more materials that are polymerizable on contact with the polymerizing agent, together with one or more photocurable materials.

4. A process according to claim 1, in which the polymerizable residue comprises a single species or two or more similar species which polymerize under the catalytic influence of the polymerizing agent.

5. A process according to claim 1, in which the polymerizable residue comprises two or more co-reacting species that are stable until reaction between them is catalyzed or accelerated by the polymerizing agent.

6. A process according to claim 4, in which the polymerizable residue and its polymerizing agent are selected from the group consisting of
   (i) a cyanoacrylate with water, aqueous ammonium hydroxide solution, an aqueous alkali metal hydroxide solution or an amine,
   (ii) an isocyanate-terminated prepolymer with water, aqueous ammonium hydroxide solution, an aqueous alkali metal hydroxide solution, or an amine,
   (iii) an epoxy resin with a boron trifluoride or boron trichloride complex, a boron difluoride chelate, dicyandiamide, an imidazole, an amine, or an acid anhydride, and
   (iv) a phenolic resin with an acid or an aqueous acidic solution.

7. A process according to claim 5 in which the polymerizable residue and its polymerizing agent are selected from the group consisting:
   (i) a mixture of a polyol and an isocyanate with aqueous ammonium hydroxide solution, an aqueous alkali metal hydroxide solution, or an amine,
   (ii) a polyene-polythiol mixture with aqueous ammonium hydroxide solution, an aqueous alkali metal hydroxide solution, or an amine,
   (iii) an epoxy resin-amine mixture with an acid, aqueous acid solution, an acid salt solution or a metal perchlorate, trifluoromethanesulfonate, trihalocarboxylate, or nitrate,
   (iv) an epoxy resin-thiol mixture with an aqueous ammonium hydroxide solution or an amine, and
   (v) a mixture of an acrylate or methacrylate and a peroxide initiator with an amine, a Schiff's base, or a transition metal or its salt.

8. A process according to claim 6, in which the polymerizable residue is
   (i) a cyanoacrylate of formula

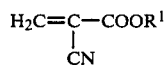

in which $R^1$ has, at most, 18 carbon atoms and is an alkyl, alkenyl, aralkyl, haloalkyl, cycloalkyl, aryl or alkoxyalkyl group,
   (ii) an isocyanate-terminated prepolymer formed by reaction of a polyol, polyamine, or polycarboxylic acid with an aliphatic, cycloaliphatic or aromatic diisocyanate,
   (iii) an epoxy resin containing at least two groups of formula

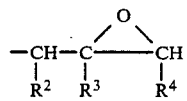

directly attached to an atom or atoms of oxygen, nitrogen or sulfur, where either $R^2$ and $R^4$ each represent a hydrogen atom, in which case $R^3$ denotes a hydrogen atom or a methyl group, or $R^2$ and $R^4$ together represent $-CH_2CH_2-$, in which case $R^3$ denotes a hydrogen atom,
   (iv) an epoxy resin in which some or all of the epoxide groups are in non-terminal positions, or
   (v) a phenolic resin that is a resole made from a phenol and an aldehyde.

9. A process according to claim 7, in which the polymerizable residue is
   (i) a mixture of an alkylene glycol, a polyoxyalkylene glycol, an alkane triol, a hydroxy group-containing reaction product of an epoxy resin with a carboxylic acid, carboxylic anhydride, phenol, primary or secondary amine, or thiol, pentaerythritol or a hydroxy group-containing polymer, with an aliphatic, cycloaliphatic or aromatic isocyanate,
   (ii) a mixture of a polyene having a molecular weight of 50 to 20,000 and containing two or more ethylenic or ethynylic bonds capable of participating in a free-radical polymerization reaction, or an epoxy resin having at least two groups of formula II or having some or all of the epoxide groups in non-terminal positions, with a polythiol having a molecular weight within the range 50 to 20,000 which is an ester of thioglycolic, alphamercaptopropionic or beta mercaptopropionic acid with a glycol, triol, tetraol, pentaol or hexol,
   (iii) a mixture of an epoxy resin having at least two groups of formula II or having some or all of the epoxide groups in non-terminal positions with an aliphatic, alicyclic, unsaturated heterocyclic, aromatic or araliphatic primary, secondary or tertiary amine, or
   (iv) a mixture of an acrylate or methacrylate monomer which is acrylic or methacrylic acid, or an alkyl acrylate, alkylenediol diacrylate, 1,1,1-trimethylolpropane triacrylate, polypropylene glycol diacrylate, allyl acrylate, an acrylate ester of an epoxide or a phenolic resole, or a corresponding methacrylate, with hydrogen peroxide, tert.butyl hydroperoxide, cumene hydroperoxide, or 2,4-dimethyl-2,4-hexane dihydroperoxide.

10. A process according to claim 1, in which the polymerizable residue, and its polymerizing agent, are selected from the group consisting of:

(i) an alkyl cyanoacrylate in which the alkyl group has 1 to 8 carbon atoms, with water, (ii) a mixture of a dual-functional hydroxyl group-containing reaction product of an epoxide resin with acrylic or methacrylic acid and a diisocyanate, with an aromatic primary amine, (iii) an epoxide resin containing at least two epoxide groups with a boron difluoride chelate, (iv) a mixture of an epoxide resin having at least two epoxide groups and an aromatic primary diamine, with a metal nitrate accelerator, (v) a dual functional reaction product of acrylic or methacrylic acid and a phenolic resole made from phenol and formaldehyde, with an acid, (vi) a mixture of a peroxide initiator and an acrylate or methacrylate of an alkylenediol or trimethylolpropane, a hydroxyalkyl acrylate or methacrylate or a reaction product of acrylic or methacrylic acid and a polyglycidyl ether of a monohydric alcohol or phenol, with a transition metal salt accelerator, and (vii) a mixture of a peroxide initiator and a dual-functional reaction product of acrylic or methacrylic acid and a phenolic resole made from phenol and formaldehyde, with a transition metal salt accelerator.

11. A process according to claim 1, in which the photocurable residue present is one in which cure is effected by direct activation of photosensitive groups through irradiation.

12. A process according to claim 11, in which the material having photosensitive groups is one having at least two azido, coumarin, stilbene, maleimido, pyridinone, chalcone, propenone, pentadienone, or anthracene groups or acrylic ester groups which are substituted in their 3-position by a group having ethylenic unsaturation or aromaticity in conjugation with the ethylenic double bond of the acrylic group.

13. A process according to claim 1, in which the photocurable residue present is one in which irradiation activates a suitable initiator molecule which then activates a photopolymerizable group.

14. A process according to claim 13, in which the photocurable residue is an epoxide resin, phenolic resin, urea-formaldehyde resin, cyclic ether, cyclic ester, cyclic sulfide, cyclic amine, or organosilicon cyclic in combination with a radiation-sensitive aromatic 'onium or iodosyl salt, or a full or partial ester of acrylic or methacrylic acid with an aliphatic monohydric alcohol, glycol, or higher functional polyol or with a compound containing one or more glycidyl groups, or an ester formed by reaction of a polyepoxide with an adduct of a hydroxyalkyl acrylate or methacrylate with a saturated or unsaturated polycarboxylic acid anhydride.

15. A process according to claim 2 in which the substance having polymerizable and photocurable groups on the same molecule is an epoxide or a phenolic resole containing a photocurable group, or, together with an isocyanate, a hydroxy compound containing a photocurable group.

16. A process according to claim 1 in which the photocurable residue is selected from the group consisting of:

(i) an epoxide resin obtained by advancement with a bisphenol of a diglycidyl ether of a bisphenol containing a pentadienone group, (ii) a cycloaliphatic epoxide resin in combination with a radiation-sensitive aromatic onium salt, (iii) methylol groups in a dual-functional reaction product of acrylic or methacrylic acid and a phenol-formaldehyde resole, in combination with a radiation-sensitive aromatic onium salt, (iv) acrylate or methacrylate groups in a dual-functional reaction product of acrylic or methacrylic acid and a phenolformaldehyde resole, (v) an acrylate or methacrylate of an alkylene diol or 1,1,1-trimethylolpropane, and (vi) a reaction product of acrylic or methacrylic acid and a polyglycidyl ether of a polyhydric alcohol or phenol.

17. A process according to claim 1 in which the polymerization stage and the photocuring stage are effected through different chemical processes.

18. A process according to claim 1, in which the polymerizing agent is applied by spraying, dipping, brushing or spin-coating, using a solution or suspension in water or an organic solvent where the agent is not a liquid.

19. A process according to claim 1, in which the modified layer is exposed to actinic radiation of wavelength 200–600 nm.

20. A substrate bearing an image produced by a process according to claim 1.

* * * * *